United States Patent [19]

Larsen et al.

[11] Patent Number: 5,057,715
[45] Date of Patent: Oct. 15, 1991

[54] CMOS OUTPUT CIRCUIT USING A LOW THRESHOLD DEVICE

[75] Inventors: Robert E. Larsen, Shingle Springs; Khandker N. Quader, Citrus Heights; Joseph H. Salmon, Placeville, all of Calif.

[73] Assignee: Intel Corporation, Santa Clara, Calif.

[21] Appl. No.: 456,081

[22] Filed: Dec. 21, 1989

Related U.S. Application Data

[63] Continuation of Ser. No. 255,361, Oct. 11, 1988, abandoned.

[51] Int. Cl.⁵ .................. H03K 19/094; H03K 17/16; H03K 17/687; H01H 37/76
[52] U.S. Cl. .................................. 307/451; 307/202.1; 307/443; 307/571; 307/585; 307/270
[58] Field of Search ............ 307/451, 443, 202.1, 307/270, 571, 576, 579, 585

[56] References Cited

U.S. PATENT DOCUMENTS

| | | | |
|---|---|---|---|
| 4,223,277 | 9/1980 | Taylor et al. | 307/451 |
| 4,274,014 | 6/1981 | Schade Jr. | 307/451 |
| 4,384,220 | 5/1983 | Segawa et al. | 307/450 |
| 4,481,705 | 11/1984 | Haskell | 357/42 |
| 4,717,847 | 1/1988 | Nolan | 307/475 |
| 4,780,626 | 10/1988 | Guerin et al. | 307/453 |
| 4,857,763 | 8/1989 | Sakurai et al. | 307/451 |

OTHER PUBLICATIONS

Joannopoulos et al., "The Physics of Hydrogenated Amorphous Silicon I, Structure, Preparation, and Devices", 1984, pp. 83–89.

Primary Examiner—Stanley D. Miller
Assistant Examiner—Trong Phan
Attorney, Agent, or Firm—Blakely, Sokoloff, Taylor & Zafman

[57] ABSTRACT

A CMOS output driver includes an n-channel low threshold device in series between a p-channel transistor and an output terminal. Under normal driver operation, the low threshold transistor drops essentially zero volts and is imperceptible in the circuit. However, under special mode conditions when high voltage is applied to the output terminal, the low threshold transistor stops conducting when the output terminal approaches Vcc, so that any further increase in the voltage at the output terminal cannot be applied to the drain of the p-channel transistor which can cause its failure.

1 Claim, 1 Drawing Sheet

FIG_1 (PRIOR ART)
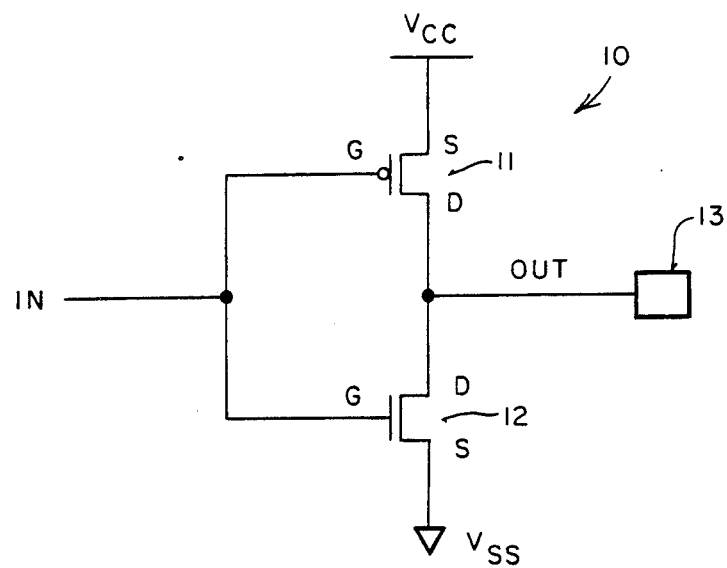
FIG_2
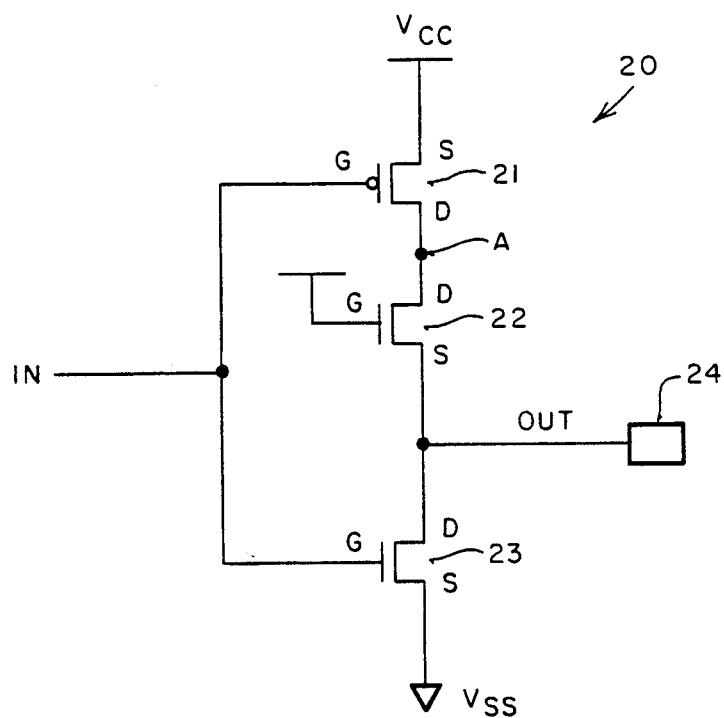

CMOS OUTPUT CIRCUIT USING A LOW THRESHOLD DEVICE

This is a continuation of application Ser. No. 255,361 filed Oct. 11, 1988 now abandoned.

BACKGROUND OF THE INVENTION

1. Field of the Invention

The present invention relates to the field of complementary metal-oxide semiconductors (CMOS) devices and more specifically to a CMOS output driver.

2. Prior Art

The use of a complementary metal-oxide semiconductor (CMOS) is well-known in the prior art. The advantages derived from using CMOS technology, which includes lower power consumption, is also well-known in the prior art. Typically, a pair of transistors is coupled in series between a supply voltage and ground, and an output is taken at the junction of the two transistors. The pair of transistors is comprised of an n-type device and a p-type device. In the simplest of operations of a CMOS pair of transistors, one or the other of the transistors is conducting at any given time so that the output, which is obtained at the junction of the two transistors, is coupled through one or the other transistor to the supply voltage or its ground.

Although CMOS devices can operate at a wider range of supply voltages than devices using other types of technology, such as transistor-transistor-logic (TTL), they are susceptible to diode break down or latch-up, if voltages higher than Vcc are applied at the output terminal. High voltages may need to be applied to the output node during special modes of operation. For example, during the manufacturing of these CMOS devices, high potentials may be applied for enabling the devices into a special function or a mode, such as a testing mode. Or in another example, high voltages may be encountered in programming a memory device, such as an electrically programmable read only memory (EPROM). In some instances, an application of high voltage would be desirable at the output node, but because of a possibility of device failure, the high voltage is not applied or severely restricted to prevent such failure of the device. In other instances, the special node voltages are applied at the input (gates of the transistors) to overcome this shortcoming or because pins are not available.

An intent of the present invention is to permit such high voltage application at the output node of a CMOS device.

SUMMARY OF THE PRESENT INVENTION

The present invention describes a CMOS output driver circuit which has a low threshold device coupled in series between the p-channel transistor and the output terminal. The low threshold device has a threshold voltage (VT) of approximately zero volts. Under normal CMOS driver operation the low threshold device drops essentially zero volts, so that the voltage present at the output terminal, when the p-channel transistor is conducting, is essentially equivalent to a prior art device not having a low threshold device.

During special mode operations, when high voltage is impressed on the output terminal, the low threshold device will conduct as long as the voltage applied at the output terminal is less than $Vcc - V_T$. However, as soon as the terminal voltage increases beyond $Vcc - V_T$, the low threshold device stops conducting and decouples the high voltage from the drain of the p-channel transistor. This decoupling effectively prevents the high voltage from being applied at the drain of the p-channel transistor. If the high voltage did reach a value greater than $Vcc + V_D$, where $V_D$ is the $p^+/n^-$ diode turn-on voltage at the drain of the p-channel transistor, then the $p^+/n^-$ junction of the drain to substrate of the p-channel transistor would be forward biased which could result in excessive current being drawn between the drain and substrate of the p-channel transistor causing, a turn on of the PNP parasitic bipolar transistor and causing a latch-up condition.

BRIEF DESCRIPTION OF THE DRAWINGS

FIG. 1 is a circuit schematic diagram of a prior art CMOS driver circuit.

FIG. 2 is a circuit schematic diagram of a CMOS driver circuit of the present invention using a low threshold transistor.

DETAILED DESCRIPTION OF THE PRESENT INVENTION

A CMOS driver circuit using a low threshold device is described. In the following description, numerous specific details are set forth such as specr threshold levels, etc., in order to provide a thorough understanding of the present invention. It will be obvious, however, to one skilled in the art that the present invention may be practiced without these specific details. In other instances, well-known structures and processes have not been described in detail in order not to unnecessarily obscure the present invention.

PRIOR ART

Referring to FIG. 1, a prior art CMOS driver circuit 10 is shown. Circuit 10 is comprised of a p-type transistor 11 and an n-type transistor 12 to form a CMOS pair. Transistor 11 has its source coupled to a supply voltage, Vcc, and its drain coupled to the drain of transistor 12. The source of transistor 12 is coupled to Vss, which in this case is ground. The gates of transistors 11 and 12 are coupled to receive an input signal. An output terminal is coupled to the junction of the two drains.

In operation, when an input signal is low, transistor 11 conducts while transistor 12 is basically cut-off. The conduction of transistor 11 couples the output terminal 13 to Vcc, placing essentially a Vcc potential onto terminal 13. Conversely, when the input is at a high level, transistor 11 is cut-off and transistor 12 conducts, placing output terminal 13 to a potential which is Vss. Circuit 10 operates as a basic CMOS inverter for the input signal.

Typically in this configuration, transistors 11 and 12 are driven by an input signal to its gate. The input voltage swing can vary over a wide range of voltages, normally between Vcc and Vss. The voltage on terminal 13 is derived from conduction of one of the transistors 11 and 12. However, in certain instances, such as during a special test mode or programming of a memory device, voltages are impressed on terminal 13. The actual value of the impressed voltage must be limited so that device diode break-down or diode forward biasing does not occur. If the voltage impressed at terminal 13 exceeds the value of $Vcc + V_D$, then it is possible to destroy device 11. $V_D$ is the $p^+/n^-$ diode turnon voltage and typically is in the range of 0.6 to 0.7 volts. The application of high voltage at the drain of transistor 11 operates to forward bias the drain of transistor 11 in respect to its substrate. Because transistor 11 is a p-type device, having its substrate coupled to Vcc, when the drain voltage is higher than Vcc+$V_D$, the p+ drain to the n- substrate is forward biased. This forward bias causes current flow to occur between the drain of transistor 11 and its substrate. If the current flow is excessive then subsequent failure of transistor 11 can occur. Alternatively, this current can act as a trigger to induce SCR latch-up in adjoining circuitry.

Therefore, the application of high voltage at the output terminal 13 must be limited to not cause this forward biasing of the drain of transistor 11 in respect to its substrate. Therefore, the high voltage application must be less than Vcc+$V_D$.

PRESENT INVENTION

In order to permit the application of high voltage at the output, the circuit of the present invention is used. Referring to FIG. 2, a circuit 20 is comprised of three transistors 21, 22 and 23 coupled in series between Vcc and Vss. Transistor 21 is a p-channel device having its source coupled to a supply voltage, Vcc. The drain of transistor 21 is coupled to the drain of transistor 22 and this junction is labeled as node A. The source of transistor 22 is coupled to the drain of transistor 23 and an output terminal 24 is also coupled to this junction. The source of transistor 23 is coupled to Vss, which in this case is ground. The gates of transistors 21 and 23 are coupled together to accept an input, while the gate of transistor 22 is coupled to a voltage, such as Vcc, or to voltages which are switched. Transistors 22 and 23 are n-channel devices with transistor 22 being a low threshold voltage (low $V_T$) device.

Transistors 21 and 23 comprise a CMOS pair and is functionally equivalent to the operation of the prior art CMOS inverter 10 in FIG. 1. That is, under normal operation the input signal, when high, will cause transistor 23 to conduct, turning off transistor 21 and thereby placing a low potential onto terminal 24. When the input signal is low, then transistor 21 conducts and transistor 23 is cut-off. Vcc is placed on the drain of transistor 22. Transistor 22 also conducts, placing approximately the potential Vcc onto terminal 24. The actual voltage is Vcc minus the threshold value $V_T$, of transistor 22 ($V_{T22}$) On terminal 24.

Transistor 22 is an n-channel zero threshold device, which has a threshold voltage of approximately zero volts. Typical transistors have threshold voltages on the order of 0.6–1.0 volts, which an applied gate-to-source voltage must overcome for it to conduct. The low threshold device will approximately have a turn-on value of 0±0.1 volts, a negative voltage being possible due to process variations during the manufacture of the transistor.

Therefore, under normal operation when transistor 21 is to conduct, transistor 22 also conducts but drops essentially zero volts across its drain and source, such that the voltage present on terminal 24 is approximately equivalent to the prior art CMOS circuit of FIG. 1. The low threshold device is essentially imperceptible under normal operation. Also, when transistor 23 is conducting, transistor 21 is cut-off and transistor 22 is essentially out of the circuit.

During a special mode of operation when high voltages are to be applied to pad 24, transistor 22 operates to isolate transistor 21 from the high voltage. When the applied voltage to terminal 24 is less than Vcc-$V_{T22}$, transistor 22 will conduct and drop the value of $V_{T22}$ across the source to drain/gate of transistor 22. The input to the gate of transistor 21 can be such as to activate transistor 21 and no harm will result. However, when the application of the voltage to terminal 24 reaches the value of Vcc-$V_{T22}$, it causes transistor 22 to cut-off. With transistor 22 in a non-conducting state, it operates to isolate transistor 21 from terminal 24. A further increase in the voltage on the apply voltage to terminal 24 is decoupled from the drain of transistor 21 due to the non-conduction of transistor 22. The high reverse break down of the n+/p− junction of transistor 22 prevents current flow through the substrate of the low threshold device, thereby protecting transistor 22. Because transistor 23 is also an n-type device, the high voltage on the drain does not cause its break down. Therefore, the placement of a low threshold device between the p-channel transistor 21 and terminal 24 causes decoupling of the p-channel transistor 21 from output terminal 24 whenever a high voltage is applied to terminal 24, which high voltage has the value of at least Vcc-$V_T$.

Manufacturing of low threshold devices are known in the prior art and are taught in U.S. Pat. Nos. 4,052,229; 4,096,584; and 4,103,189, which are incorporated by reference herein.

Thus a CMOS output circuit using a low threshold device is disclosed.

We claim:

1. A complementary metal-oxide semicondutor (CMOS) driver circuit for tolerating a high voltage at its output comprising:
   a p-channel transistor having its source coupled to a supply voltage and its gate coupled to accept an input signal;
   a first n-channel transistor having substantially zero threshold level for preventing a high voltage approaching said supply voltage from being coupled to the drain of said p-channel transistor, wherein said first n-channel transistor has its drain coupled to the drain of said p-channel transistor, its gate coupled to a power voltage and its source coupled to an output terminal;
   a second n-channel transistor having its drain coupled to said output terminal and to the source of said first n-channel transistor, its source coupled to a return of said supply voltage, and its gate coupled to accept said input signal;
   said p-channel transistor and said second n-channel transistor operating as a CMOS driver, wherein said first n-channel transistor provides for substantially zero volts to be dropped across it when conducting, wherein said first n-channel transistor ceases conduction and disconnects said p-channel transistor from said output terminal in order to prevent destruction of said p-channel transistor when said high voltage approaching said supply voltage is impressed at said output terminal.

* * * * *

UNITED STATES PATENT AND TRADEMARK OFFICE
CERTIFICATE OF CORRECTION

PATENT NO. : 5,057,715
DATED : October 15, 1991
INVENTOR(S) : Robert Larsen, Khandker N. Quader & Joseph H. Salmon It is certified that error appears in the above-indentified patent and that said Letters Patent is hereby corrected as shown below:

Column 2, line 26, delete "specr" and insert --specific--.

Column 4, line 42, after the word "substantially" insert --a--.

Signed and Sealed this

Twelfth Day of July, 1994

BRUCE LEHMAN

Attest:

Attesting Officer         Commissioner of Patents and Trademarks